United States Patent [19]

Miyamoto et al.

[11] 4,112,373
[45] Sep. 5, 1978

[54] SELF-EXCITED MIXER CIRCUIT USING FIELD EFFECT TRANSISTOR

[75] Inventors: Hiroshi Miyamoto; Mitsuhisa Shinagawa, both of Yokohama, Japan

[73] Assignee: Hitachi, Ltd., Japan

[21] Appl. No.: 759,412

[22] Filed: Jan. 14, 1977

[30] Foreign Application Priority Data

Jan. 19, 1976 [JP] Japan .................................. 51-4103
Jan. 19, 1976 [JP] Japan .................................. 51-4104
Jan. 19, 1976 [JP] Japan .................................. 51-4105
Dec. 1, 1976 [JP] Japan .................................. 51-143332

[51] Int. Cl.² ........................................... H04B 1/28
[52] U.S. Cl. ..................................... 325/440; 325/451
[58] Field of Search ............... 325/440, 451, 491, 318, 325/441, 450; 328/214; 331/58

[56] References Cited

U.S. PATENT DOCUMENTS

| | | | |
|---|---|---|---|
| 3,348,155 | 10/1967 | Von Recklinghausen | 325/440 |
| 3,510,781 | 5/1970 | Wollesen | 325/451 |
| 3,863,136 | 1/1975 | Hanson | 325/451 |

*Primary Examiner*—Robert L. Griffin
*Assistant Examiner*—Marc E. Bookbinder
*Attorney, Agent, or Firm*—Craig & Antonelli

[57] ABSTRACT

A self-excited mixer circuit using a dual gate type field effect transistor, in which an inductive impedance element inductive with respect to a local oscillation frequency, a first capacitive element and a second capacitive element are connected across the drain and the second gate, across the drain and the source, and across the second gate and the source, respectively, of field effect transistor to constitute an oscillation circuit across the drain and the second gate of transistor, so as to derive an intermediate frequency signal from the drain of the transistor in response to the application of the radio frequency signal to the first gate of transistor.

21 Claims, 7 Drawing Figures

SELF-EXCITED MIXER CIRCUIT USING FIELD EFFECT TRANSISTOR

This invention relates to self-excited mixer circuits used in high-frequency systems of FM receivers, television receiving sets and the like.

As is commonly acknowledged, a self-excited mixer circuit is less expensive than a separately excited mixer circuit. This is because, in the case of the former, the function of local oscillation and the function of frequency conversion are done by a single active element, whereas, in the case of the latter, two active elements are required for achieving these two respective functions. However, successful production of such self-excited mixer circuit has been encountered with considerable technical difficulty due to the fact that the optimum bias point for the single active element for determining the rate of feedback of a local oscillation signal mixed with a radio frequency signal differs from that for determining the stability of sustained oscillation, and differs also from that for determining the conversion gain. Because of the above technical difficulty, a self-excited mixer circuit using a field effect transistor (referred to hereinafter as an FET) has not been developed yet, although that using a bipolar transistor has been developed already and is presently put into practical use.

However, such a conventional self-excited mixer circuit using a bipolar transistor has not been satisfactory in the function of eliminating cross modulation and had to be improved in this function. It has therefore been strongly demanded to realize a self-excited mixer circuit using an FET which is better in its cross modulation eliminating ability than that using a bipolar transistor, in principle.

Incorporation of the conventional self-excited mixer circuit using the bipolar transistor in a tuner such as a television tuner or a radio tuner has resulted in insufficient tuner performance against cross modulation interference, internal modulation interference and other undesirable interference due to the non-linear characteristic of the bipolar transistor used as the active element.

It is therefore an object of the present invention to provide a self-excited mixer circuit using an FET which is better in its cross modulation eliminating ability than that using a bipolar transistor.

Another object of the present invention is to provide a self-excited mixer circuit which obviates the aforementioned prior art defect and improves the tuner performance against various interference including cross modulation interference and internal modulation interference.

With these objects in view, there is proposed according to one aspect of the invention a stably operable self-excited mixer circuit of high conversion gain in which a dual gate type FET is used as its active element and a characteristic oscillation circuit is connected across the second gate and the drain of the FET so as to suppress abnormal oscillation at an intermediate frequency and permit the supply of a local oscillation signal in a most suitable amount.

According to another aspect of the invention, there is proposed a self-excited mixer circuit suitable for incorporation in the high-frequency system of an FM receiver, a television receiving set or the like, in which a dual gate type FET is used as its active element so as to provide an improved cross modulation eliminating ability, and a local oscillation frequency signal feedback loop is isolated from a radio frequency signal input section thereby obviating mutual interference therebetween.

The above and other objects, features and advantages of the present invention will become more apparent from the following detailed description of the present invention made by referring to the preferred embodiments when taken in conjunction with the accompanying drawings, in which.

Figure 1:
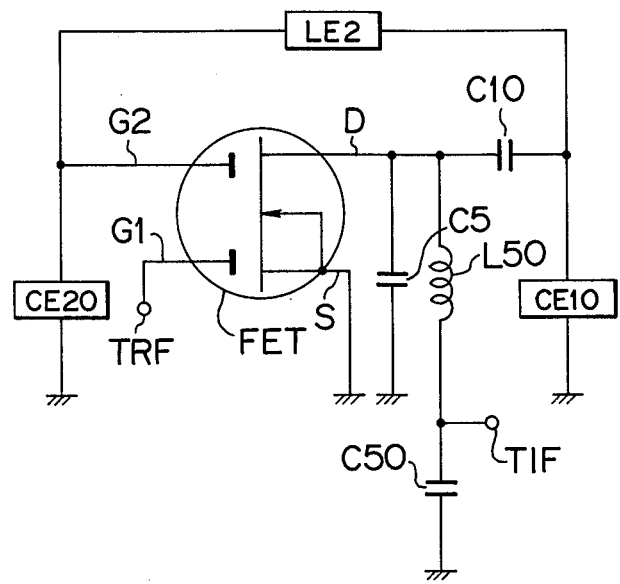
FIG. 1 shows a basic circuit of a first embodiment of the self-excited mixer circuit according to the present invention using a dual gate type FET.

Referring first to FIG. 1 illustrating a first embodiment of the present invention, there is shown a self-excited mixer circuit using a dual gate type FET. In FIG. 1, the symbol FET designates a dual gate type FET having a first gate G1 and a second gate G2, and the symbols D and S designate a drain and a grounded source respectively.

FIG. 1 shows a basic circuit form of part of a fourth embodiment of the self-excited mixer circuit according to the present invention. In FIG. 1, the mixer circuit is shown with its D.C. circuit part, that is, the bias circuits for the first and second gates G1 and G2, and the drain D, omitted, to illustrate the basic arrangement of its high-frequency circuit part.

Referring to FIG. 1, a dual gate type FET is grounded at its drain D through a capacitor C5 and also through a π-type IF tuning section including an inductor L50 and a capacitor C50. An output signal of intermediate frequency appears at an IF output terminal TIF connected to the connection point of the inductor L50 and capacitor C50. The drain D is connected to the second gate G2 of FET through a coupling capacitor C10 and an inductive impedance element LE2, and the connection point of the capacitor C10 and inductive impedance element LE2 is grounded through a capacitive impedance element CE10. The dual gate type FET is grounded at its second gate G2 through another capacitive impedance element CE20.

In operation, a high-frequency voltage appearing at the drain D of FET is divided by the capacitor C10 and capacitive impedance element CE10 to be fed back to the second gate G2 of FET through the inductive impedance element LE2 and capacitive impedance element CE20 while oscillating at a resonance frequency which is determined by the values of the capacitor C10, capacitive impedance elements CE10 and CE20, inductive impedance element LE2, capacitor C5, drain impedance of FET, and second gate impedance of FET. A radio frequency signal transmitted to an RF input terminal TRF is mixed with the local oscillation frequency signal in the FET, and after being amplified by the FET, the resultant output appearing at the drain D of FET passes through the π-type IF tuning section consisting of the capacitor C5, drain impedance, inductor L50 and capacitor C50 to appear as an intermediate frequency signal at the IF output terminal TIF.

The capacitor C10 functions to ensure satisfactory impedance separation between the intermediate frequency band and the total oscillation frequency band and has a relatively small capacitance value when there is a small frequency difference between the intermediate frequency band and the local oscillation frequency band.

The capacitive impedance element CE20 connected to the second gate G2 of FET may be unnecessary when this second gate G2 has a capacitive impedance. However, the capacitive impedance element CE20 is preferably connected to the second gate G2 of FET with a view to deal with such an indefinite factor as fluctuation of the property of the FET.

In an application to a tuner such as a television tuner, it is necessary to make the local oscillation frequency variable depending on the television channels. In sucha case, the inductance value of the inductive impedance element LE2 or the capacitance value of the capacitive impedance element CE10 may be made variable.

Figure 2:
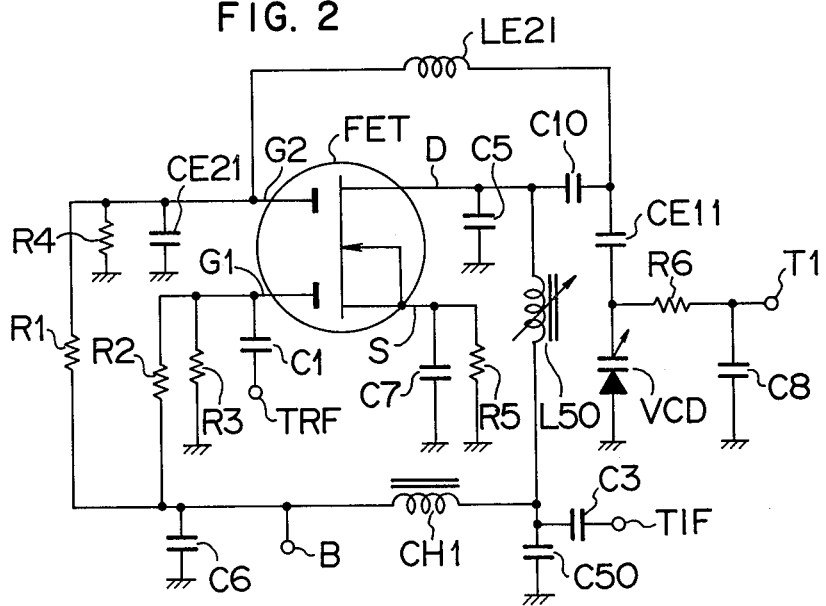
FIG. 2 is a practical circuit diagram of the first embodiment of the present invention.

FIG. 2 shows a practical circuit structure of the first embodiment shown in FIG. 1, in which a capacitor CE21 is used as the capacitive impedance element CE20, and a variable capacitance diode VCD is used as the capacitive impedance element CE10 so as to make variable the local oscillation frequency. In FIG. 2, the same symbols are used to designate the same or like parts appearing in FIG. 1.

The D.C. circuit part of the mixer circuit includes a power supply terminal B from which bias voltage is supplied to the first gate G1 of the FET through bias resistors R2 and R3, and to the ground gate G2 of FET through bias resistors R1 and R4. Voltage is supplied from the lower supply terminal B to the drain D of FET through a choke coil CH1 and IF tuning coil L50. Tuning voltage is applied from a tuning voltage input terminal T1 to the variable capacitance diode VCD through a resistor R6 to vary the capacitance of this diode VCD. Bypass capacitors C6, C7 and C8 are connected across the power supply terminal B and ground, across the source S of FET and ground, and across the tuning voltage input terminal T1 and ground, respectively.

In the high-frequency circuit part of the mixer circuit, the inductive impedance element LE2 and capacitive impedance element CE20 shown in FIG. 1 are replaced by a resonant inductor LE21 and a capacitor CE21 respectively. Further, the capacitive impedance element CE10 shown in FIG. 1 is replaced by a group of variable capacitance elements, including a capacitor CE11 and variable capacitance diode VCD, which act to block the flow of direct current and control the variable local oscillation frequency range. In FIG. 2, the local oscillation frequency is varied by the voltage applied to the variable capacitance diode VCD, so that one of intermediate frequency signals of selected frequency can be derived from the IF output terminal TIF in response to the application of one of a plurality of radio frequency signals to the RF input terminal TRF.

Figure 3:
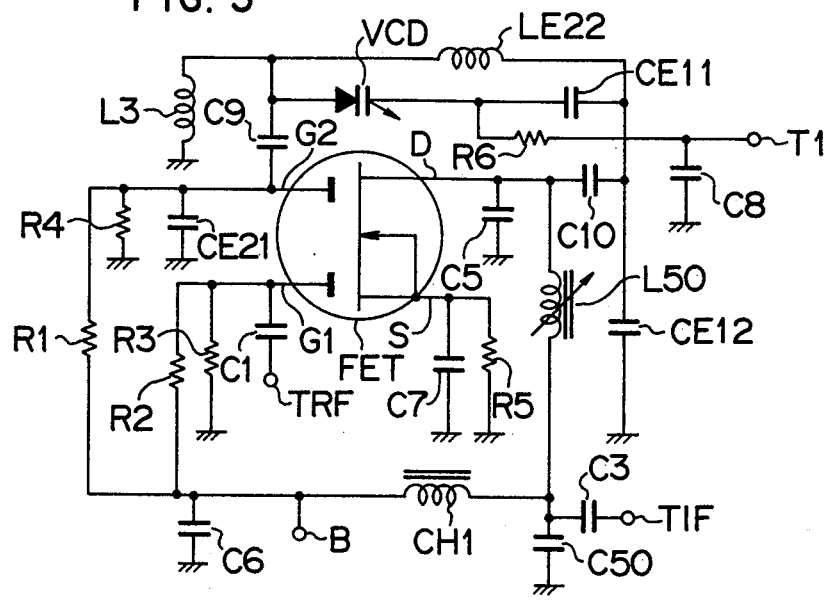
FIG. 3 is a circuit diagram of a second embodiment of the present invention.

FIG. 3 shows a second embodiment of the present invention which is a partial modification of the first embodiment shown in FIGS. 1 and 2. Referring to FIG. 3, the inductive impedance element LE2 shown in FIG. 1 is replaced by a parallel resonance circuit including a group of variable capacitance elements. This resonant circuit comprises a resonant inductor LE22 connected in parallel with the capacitor CE11 and variable capacitance diode VCD. It will be noted that the positions of the capacitor CE11 and variable capacitance diode VCD differ from those shown in FIG. 2. In FIG. 3, capacitors CE12 and CE21 are respectively used as the capacitive impedance elements CE10 and CE20 shown in FIG. 1.

In the mixer circuit shown in FIG. 3, the capacitance value of the variable capacitance diode VCD connected in parallel with the resonant inductor LE22 is varied to vary the equivalent inductive value of the parallel resonance circuit thereby varying the local oscillation frequency. An inductor L3 is provided to ground the variable capacitance diode VCD in D.C. fashion.

Figure 4:
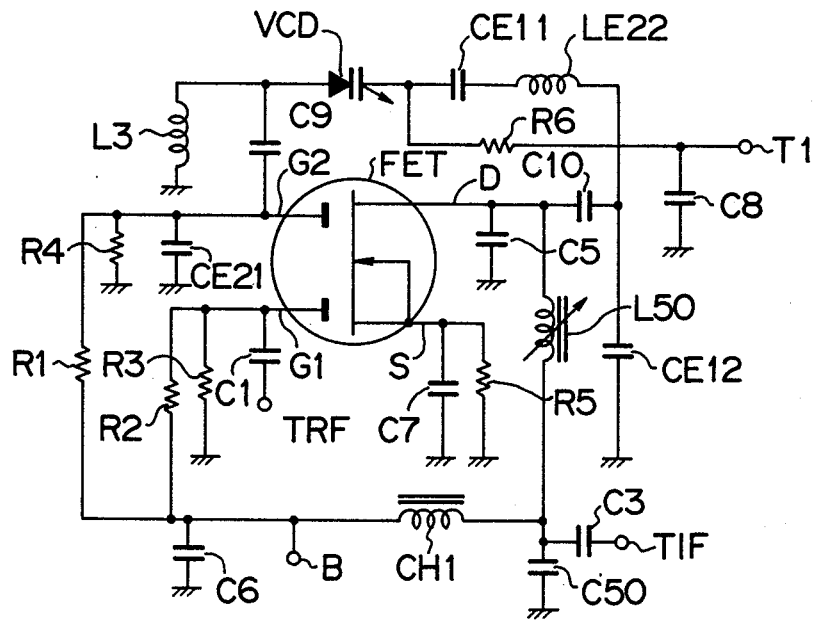
FIG. 4 shows a circuit diagram of a third embodiment of the present invention.

FIG. 4 shows a third embodiment of the present invention which is also a partial modification of the first embodiment shown in FIGS. 1 and 2. Referring to FIG. 4, the inductive impedance element LE2 shown in FIG. 1 is replaced by a series resonance circuit including a resonant inductor LE22 connected in series with the capacitor CE11 and variable capacitance diode VCD. It will be noted that the positions of the capacitor CE11 and variable capacitance diode VCD differ from those shown in FIG. 2.

In the mixer circuit shown in FIG. 4, the value of voltage applied from the terminal T1 to the variable capacitance diode VCD through the resistor R6 is varied to vary the capacitance value of the variable capacitance diode VCD thereby varying the equivalent inductance value of the series resonance circuit for varying the local oscillation frequency. In FIG. 4, capacitors CE12 and CE21 are used respectively as the capacitive impedance elements CE10 and CE20 shown in FIG. 1.

Figure 5:
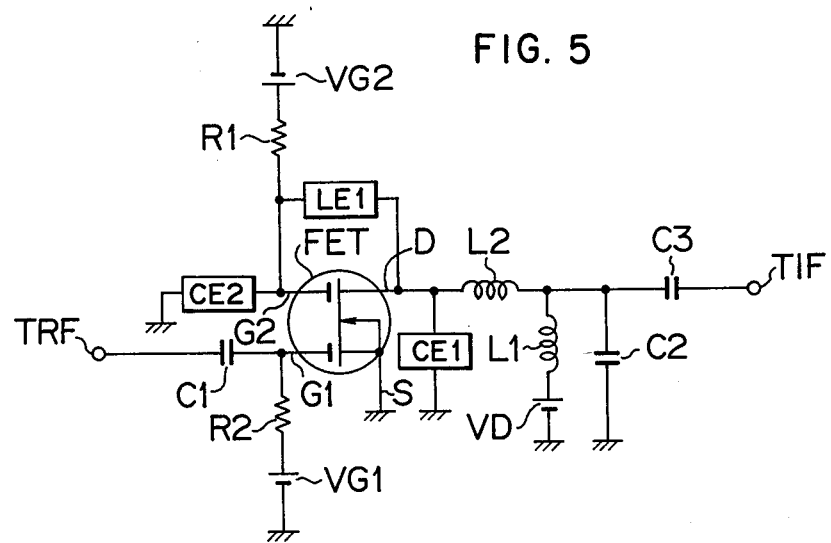
FIG. 5 shows a circuit diagram of a fourth embodiment of the present invention.

In FIG. 5 showing a fourth embodiment of the present invention, the same symbols are used to designate the same or like parts appearing in FIGS. 1 to 4.

The D.C. circuit part of the mixer circuit includes a D.C. power source VG2 for D.C. biasing the second gate G2 of the FET, another D.C. power source VG1 for D.C. biasing the first gate G1 of FET, and another D.C. power source VD for controlling the drain D of FET. The power source VG2 applied its voltage to the second gate G2 of FET through a resistor R1, and the power source VG1 applies its voltage to the first gate G1 of the FET through another resistor R2, while the power source VD applies its voltage to the drain D of FET through a choke coil L1 and a coil L2.

In the high-frequency circuit part of the mixer circuit, a radio frequency signal is applied from an RF input terminal TRF to the first gate G1 of FET through a coupling capacitor C1. A capacitive impedance element CE1, which is capacitive with respect to a local oscillation frequency, is connected across the drain D of the FET and ground. An inductive impedance element LE1, which is inductive with respect to the local oscillation frequency, is connected across the drain D and the second gate G2 of FET. Another capacitive circuit element CE2, which is capacitive with respect to the local oscillation frequency, is connected across the second gate G2 of FET and ground. These circuit elements CE1, LE1 and CE2 constitute a feedback loop which determines the local oscillation frequency. An intermediate frequency (IF) tuning section consisting of a coil L2 and a capacitor C2 is connected to the drain D of the FET, and an IF output terminal TIF is connected through a coupling capacitor C3 to the connection point of the coil L2 and capacitor C2. An intermediate frequency component appears at this IF output terminal TIF.

In operation, a radio frequency signal transmitted to the RF input terminal TRF is mixed with a local oscillation frequency signal produced by the feedback loop consisting of the circuit elements CE1, LE1 and CE2 connected across the drain D and the second gate G2 of FET, and the resultant signal of intermediate frequency representing the frequency difference between the radio frequency signal and the local oscillation frequency signal is trapped by the IF tuning section consisting of the circuit elements L2 and C2 connected to the drain D of FET to appear at the IF output terminal TIF.

The mixer circuit according to the present invention is thus specifically featured by the fact that the dual gate type FET capable of satisfactorily eliminating cross modulation is used as its active element, and the local oscillation frequency signal feedback loop is isolated from the radio frequency signal input section. By virtue of the use of the dual gate type FET, the self-excited mixer circuit of the present invention exhibits a cross modulation eliminating function better than that of the aforementioned conventional one using the bipolar transistor. Also, by virtue of the isolation of the local oscillation frequency signal feedback loop from the radio frequency signal input section by interposing all the feedback circuit elements beteeen the drain and the second gate of FET, input matching is facilitated, and undesirable interference between the RF input section and the local oscillation section can be avoided to improve the mixing characteristic.

In an application of the mixer circuit of the present invention to, for example, a television tuner, it is necessary to make the local oscillation frequency variable so as to meet a variety of television channels. This is easily done by making variable the inductance value of the inductive impedance element LE1 or the capacitance value of the capacitive impedance element CE2 depending on the television channels.

Figure 6:
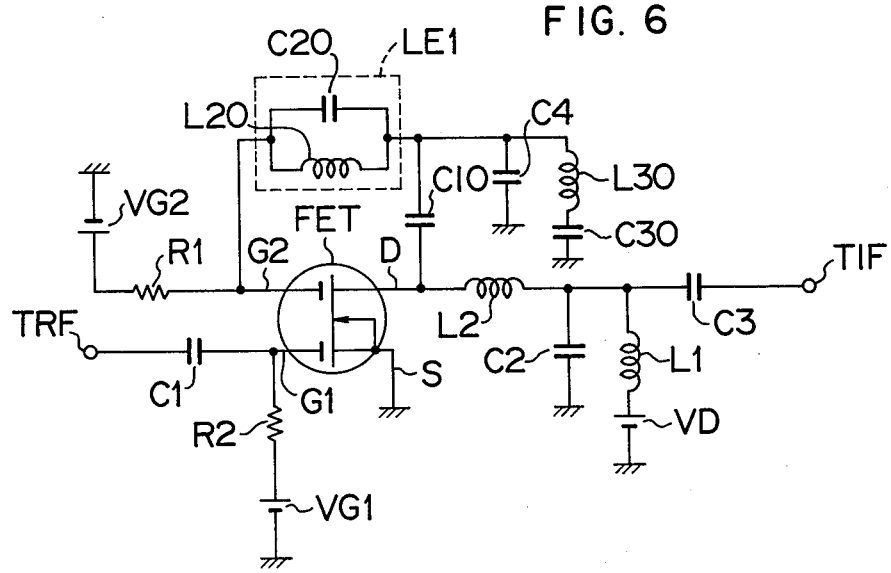
FIG. 6 is a circuit diagram of a fifth embodiment of the present invention.

FIG. 6 shows a fifth embodiment of the self-excited mixer circuit according to the present invention, and the same symbols are used in FIG. 6 to designate the same or like circuit elements appearing in FIG. 5, since this embodiment is a modification of the fourth embodiment. This fifth embodiment is the same as the fourth embodiment in its D.C. circuit part, but differs from the fourth embodiment in its high-frequency circuit part as described below.

Referring to FIG. 6, a coupling capacitor C10 is connected at one terminal thereof to the drain D of dual gate type FET. Connected across the other terminal of this coupling capacitor C10 and the second gate G2 of FET is a resonance circuit which determines the local oscillation frequency of the mixer circuit. This resonance circuit is composed of a capacitor C20 and a coil L20 which are connected in parallel and correspond to the inductive impedance element LE1 employed in the first embodiment. A DC-component blocking capacitor C4 is connected across the other terminal of the coupling capacitor C10 and the ground. Connected also across the other terminal of the coupling capacitor C10 and the ground is another resonance circuit composed of a coil L30 and a capacitor C30 which are connected in series to resonate in the vicinity of the intermediate frequency. The aforementioned circuit elements connected across the drain D and the second gate G2 of FET provide the feedback loop.

In operation, a radio frequency signal transmitted to the RF input terminal TRF is mixed with the local oscillation frequency signal produced by the feedback loop consisting of the circuit elements C10, C20 and L20 connected across the drain D and the second gate G2 of FET, and the resultant signal of intermediate frequency representing the frequency difference between the radio frequency signal and the local oscillation frequency signal is trapped by the IF tuning section consisting of the circuit elements C2 and L2 to appear at the output terminal TIF.

The fifth embodiment of the present invention is thus specifically featured by the fact that the circuit elements C10, C20 and L20 constituting the feedback loop are connected across the drain D and the second gate G2 of FET. The circuit constant of the resonance circuit consisting of the capacitors C4, C30 and coil L30 is preferably determined so that this resonance circuit can be rendered resonant at substantially the intermediate frequency. When the circuit constant of the resonance circuit is so determined, this resonance circuit provides such an extremely high impedance against the local oscillation frequency, which is equivalent to the presence of an impedance in the capacitor C4. Therefore, this resonance circuit traps the intermediate frequency so that the signal of intermediate frequency can be prevented from entering the feedback loop, and the efficiency of frequency conversion can be improved.

According to this fifth embodiment of the present invention, the local oscillation frequency component can be most suitably divided by the capacitors C4 and C10 to be fed back to the second gate G2 of FET without in any way affecting the intermediate frequency component. Thus, the local oscillation frequency component can be fed back with high stability thereby ensuring a high conversion gain. An experiment was conducted to prove the advantage of the fifth embodiment of the present invention over the conventional one. The experimental results proved that the gain of frequency conversion was 16 to 18 dB, and the frequency band width BW was 6 to 8 MHz in the hiband of the VHF range. The parallel resonance circuit consisting of the capacitor C20 and coil L20 in FIG. 6 may be replaced by a series resonance circuit which exhibits also an entirely similar effect. As described with reference to the fourth embodiment, the fifth embodiment is also applicable to a television tuner. In such a case, the value of the capacitor C20 and/or coil L20 must be made variable.

It will be understood from the above description that the fifth embodiment of the present invention ensures also a high conversion gain due to the fact that the local oscillation frequency component can be fed back in a most suitable amount without lowering the impedance at the intermediate frequency of the feedback loop connected across the drain and the second gate of FET.

Figure 7:
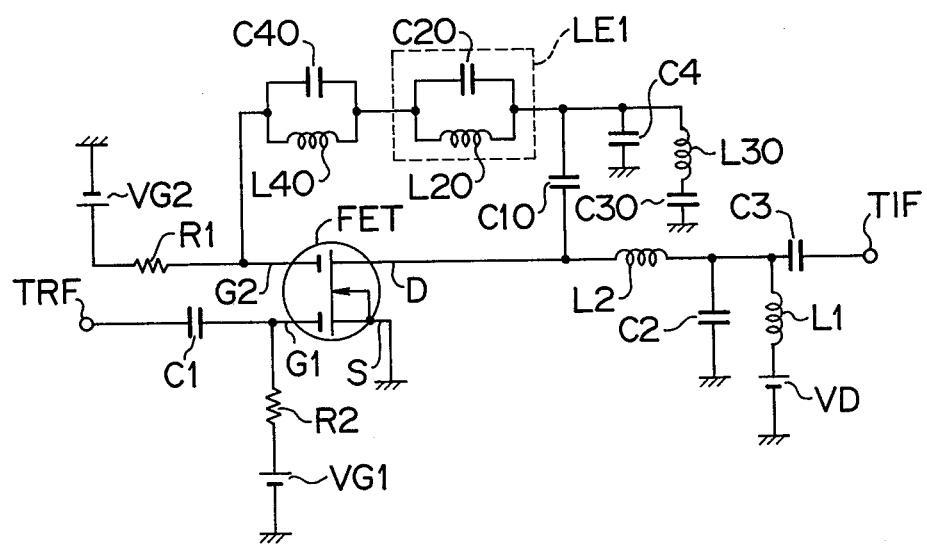
FIG. 7 is a circuit diagram of a sixth embodiment of the present invention.

FIG. 7 shows a sixth embodiment of the self-excited mixer circuit according to the present invention, and the same symbols are used in FIG. 7 to designate the same or like parts appearing in FIG. 6, since this embodiment is a modification of the fifth embodiment. This sixth embodiment is the same as the fifth embodiment in its D.C. circuit part, but differs slightly from the fifth embodiment in its high-frequency circuit part as described below.

Referring to FIG. 7, the feedback loop connected across the drain D and the second gate G2 of dual gate type FET includes, in addition to the coupling capacitor C10 and parallel resonance circuit consisting of the capacitor C20 and coil L20, another parallel resonance circuit consisting of a capacitor C40 and a coil L40 for preventing feedback of the intermediate frequency component. This second parallel resonance circuit is connected in series with the first parallel resonance circuit which becomes resonant at the local oscillation frequency. Although the second resonance circuit is shown disposed nearer to the second gate G2 of FET than the first resonance circuit, the operation and effect are the same even when the above relation is reversed.

In operation, a radio frequency signal transmitted to the RF input terminal TRF is similarly mixed with the local oscillation frequency signal produced by the feedback loop, and the resultant signal of intermediate frequency appears similarly at the IF output terminal TIF. In this sixth embodiment, the circuit constant of the second resonance circuit consisting of the capacitor C40 and coil L40 is selected so that the circuit becomes resonant at substantially the intermediate frequency, and thus, any appreciable signal component of intermediate frequency would not be fed back through the feedback loop when looked from the drain D of FET. It is therefore possible to prevent parasitic oscillation at the intermediate frequency and increase the conversion gain. The local oscillation frequency component is divided by the capacitors C10 and C4 so that the local oscillation frequency component can be fed back in a most suitable amount without lowering the impedance against the intermediate frequency. Thus, an intermediate frequency component which may appear in the feedback loop can be trapped by both the first resonance circuit consisting of L30 and C30 and the second resonance circuit consisting of L40 and C40 disposed in the feedback loop, which contributes to the desired improvement in the efficiency of frequency conversion like the aforementioned fourth and fifth embodiments. The valve of the capacitor C20 and/or coil L20 may be made variable.

It will be understood from the above description of the sixth embodiment of the present invention that undesirable parasitic oscillation at the intermediate frequency can be prevented due to the fact that the feedback loop connected across the drain D and the second gate G2 of FET exhibits a high impedance at the intermediate frequency. Further, a high conversion gain can be obtained due to the fact that the local oscillation frequency component can be fed back in a most suitable amount without lowering the impedance at the intermediate frequency of the feedback loop connected across the drain D and the second gate G2 of FET. The second parallel resonance circuit consisting of the capacitor C40 and coil L40 in FIG. 7 may be replaced by a series resonance circuit which exhibits also an entirely similar effect.

It will be understood from the foregoing detailed description that the self-excited mixer circuit according to the present invention is advantageously applicable to a television tuner or radio tuner for improving the tuner performance against cross modulation interference and internal modulation interference resulting from the non-linearity of third and higher orders. Especially, in a VHF tuner, the picture carrier frequency, sound carrier frequency and local oscillation frequency allotted to the channel No. 6 of the television channel system employed in the United States of America tend to interfere to produce a color beat interference due to the above non-linearity, and similarly, the sound carrier frequency and local oscillation frequency allotted to the channel No. 4 of the television channel system employed in the European Communities tend to interfere to produce a color beat interference due to the above non-linearity. The mixer circuit according to the present invention is especially effective in obviating such a color beat interference.

What is claimed is:

1. A self-excited mixer circuit comprising a dual gate field effect transistor having a source, a drain, a first gate and a second gate, said field effect transistor being grounded at said source, a capacitor connected at one terminal thereof to the drain of said field effect transistor, a first capacitive impedance element connected across the other terminal of said capacitor and ground, an inductive impedance element connected across the other terminal of said capacitor and the second gate of said field effect transistor, said capacitive impedance element and said inductive impedance element constituting an oscillation circuit across the drain and the second gate of said field effect transistor, means for applying a radio frequency signal to the first gate of said field effect transistor, and means for deriving the resultant signal of a predetermined intermediate frequency from the drain of said field effect transistor, wherein circuit constants of said impedance elements are provided so as to be able to derive said predetermined intermediate frequency from the drain upon receiving said radio frequency signal at the first gate of said field effect transistor.

2. A mixer circuit as claimed in claim 1, further comprising a second capacitive impedance element connected across the second gate of said field effect transistor and ground to form a Colpitts oscillation circuit.

3. A mixer circuit as claimed in claim 1, wherein said first capacitive impedance element is a variable capacitance element.

4. A mixer circuit as claimed in claim 1, wherein said inductive impedance element is a variable inductance element.

5. A mixer circuit as claimed in claim 1, wherein said inductive impedance element comprises a group of elements including a variable capacitance element connected in parallel with an inductor.

6. A mixer circuit as claimed in claim 1, wherein said inductive impedance element comprises a group of elements including a variable capacitance element connected in series with an inductor.

7. A mixer circuit as claimed in claim 1, wherein a series circuit composed of a second capacitive impedance element and a second inductive impedance element for being resonated at the predetermined intermediate frequency is connected to the drain of said field effect transistor, and predetermined intermediate frequency is derived from a connection point between said second capacitive impedance and said second inductive impedance elements.

8. A self-excited mixer circuit comprising a dual gate type field effect transistor having a source, a drain, a first gate and a second gate, said field effect transistor being grounded at said source, an inductive impedance element connected across the drain and the second gate of said field effect transistor, said inductive impedance element being inductive with respect to a local oscillation frequency, a first capacitive impedance element connected across the drain of said field effect transistor and ground, a second capacitive impedance element connected across the second gate of said field effect transistor and ground, said inductive impedance element and said first and second capacitive impedance elements constituting an oscillation circuit across the drain and the second gate of said field effect transistor, means for applying a radio frequency signal to the first gate of said field effect transistor, and means for deriving the resultant signal of a predetermined intermediate frequency from the drain of said field effect transistor, wherein the values of said inductive impedance element and said first and second capacitive impedance elements are provided so as to be able to derive said predetermined intermediate frequency from the drain upon receiving said radio frequency signal at the first gate of said field effect transistor.

9. A mixer circuit as claimed in claim 8, wherein the inductance value of said inductive impedance element is variable.

10. A mixer circuit as claimed in claim 8, wherein the capacitance value of said first capacitive impedance element is variable.

11. A mixer circuit as claimed in claim 8, wherein a series circuit composed of a second capacitive impedance element and a second inductive impedance element for being resonated at the predetermined intermediate frequency is connected to the drain of said field effect transistor, and the predetermined intermediate frequency is derived from a connection point between said impedance and inductive impedance elements.

12. A self-excited mixer circuit comprising a dual gate type field effect transistor having a source, a drain, a first gate and a second gate, said field effect transistor being grounded at said source, a coupling capacitor connected at one terminal thereof to the drain of said field effect transistor, a first resonance circuit connected across the other terminal of said coupling capacitor and ground to be rendered resonant at substantially an intermediate frequency, a second resonance circuit connected across said other terminal of said coupling capacitor and the second gate of said field effect transistor to determine substantially a local oscillation frequency, means for applying a radio frequency signal to the first gate of said field effect transistor, and means for deriving the resultant signal of a predetermined intermediate frequency from the drain of said field effect transistor, wherein the value of said coupling capacitor and the values of the elements comprising said second resonance circuit are provided so as to be able to derive said predetermined intermediate frequency from the drain upon receiving said radio frequency signal at the first gate of said field effect transistor.

13. A mixer circuit as claimed in claim 12, wherein said second resonance circuit comprises an inductance element and a capacitance element connected in parallel.

14. A mixer circuit as claimed in claim 12, wherein said first resonance circuit comprises an inductance element and a capacitance element connected in series.

15. A mixer circuit as claimed in claim 12, wherein said second resonance circuit is a variable resonance circuit.

16. A mixer circuit as claimed in claim 12, wherein a series circuit composed of a capacitive impedance element and an inductive impedance element for being resonated at the predetermined intermediate frequency is connected to the drain of said field effect transistor, and the predetermined intermediate frequency is derived from a connection point between said impedance and inductive impedance elements.

17. A self-excited mixer circuit comprising a dual gate field effect transistor having a source, a drain, a first gate and a second gate, said field effect transistor being grounded at said source, a coupling capacitor connected at one terminal thereof to the drain of said field effect transistor, a first resonance circuit connected across the other terminal of said coupling capacitor and ground to be rendered resonant at substantially an intermediate frequency, a parallel resonance circuit connected across said other terminal of said coupling capacitor and the second gate of said field effect transistor to determine substantially a local oscillation frequency, a second resonance circuit connected in series with said parallel resonance circuit across said other terminal of said coupling capacitor and said second gate of said field effect transistor and to be rendered resonant at substantially said intermediate frequency, means for applying a radio frequency signal to the first gate of said field effect transistor, and means for deriving the resultant signal of a predetermined intermediate frequency from the drain of said field effect transistor, wherein the value of said coupling capacitor and the values of the elements comprising said parallel resonance circuit are provided so as to be able to derive said predetermined intermediate frequency from the drain upon receiving said radio frequency signal at the first gate of said field effect transistor.

18. A mixer circuit as claimed in claim 17, wherein said first resonance circuit comprises an inductance element and a capacitance element connected in series.

19. A mixer circuit as claimed in claim 17, wherein said parallel resonance circuit is a variable resonance circuit.

20. A mixer circuit as claimed in claim 17, wherein a series circuit composed of a capacitive impedance element and an inductive impedance element for being resonated at the predetermined intermediate frequency is connected to the drain of said field effect transistor, and the predetermined intermediate frequency is derived from a connection point between said impedance and inductive impedance elements.

21. A mixer circuit as claimed in claim 17, wherein said second resonance circuit comprises a capacitive impedance and an inductive impedance connected in parallel.

* * * * *